United States Patent
Sarig

(10) Patent No.: US 7,280,405 B2
(45) Date of Patent: Oct. 9, 2007

(54) INTEGRATOR-BASED CURRENT SENSING CIRCUIT FOR READING MEMORY CELLS

(75) Inventor: Erez Sarig, Hertzeliya (IL)

(73) Assignee: Tower Semiconductor Ltd., Migdal Haemek (IL)

(*) Notice: Subject to any disclaimer, the term of this patent is extended or adjusted under 35 U.S.C. 154(b) by 0 days.

(21) Appl. No.: 11/304,168

(22) Filed: Dec. 13, 2005

(65) Prior Publication Data

US 2006/0126389 A1    Jun. 15, 2006

Related U.S. Application Data

(60) Provisional application No. 60/635,851, filed on Dec. 14, 2004.

(51) Int. Cl.
  *G11C 16/06*    (2006.01)
(52) U.S. Cl. .................. 365/185.21; 365/185.17; 365/185.2
(58) Field of Classification Search ........... 365/185.17, 365/185.21, 185.2
  See application file for complete search history.

(56) References Cited

U.S. PATENT DOCUMENTS

| | | | |
|---|---|---|---|
| 5,999,454 A * | 12/1999 | Smith | ............ 365/185.21 |
| 6,128,226 A | 10/2000 | Eitan et al. | |
| 6,836,443 B2 * | 12/2004 | Dadashev | ............ 365/207 |
| 6,937,532 B2 | 8/2005 | Hatanaka et al. | |
| 6,954,393 B2 | 10/2005 | Lusky et al. | |
| 6,963,505 B2 | 11/2005 | Cohen | |
| 2005/0180220 A1 * | 8/2005 | Chen et al. | ............ 365/189.01 |
| 2006/0062042 A1 * | 3/2006 | Karlsson et al. | ............ 365/145 |

* cited by examiner

*Primary Examiner*—Hoai V. Ho
(74) *Attorney, Agent, or Firm*—Bever, Hoffman & Harms, LLP; Patrick T. Bever

(57) ABSTRACT

Near-ground sensing of non-volatile memory (NVM) cells is performed on a selected NVM cell by applying a potential to a first terminal, coupling a second terminal to ground, and then decoupling the second terminal and passing the resulting cell current to an integrator, which generates a corresponding sense voltage. The amount of cell current (and resulting sense voltage) is controlled by the programmed/erased state of the NVM cell. The sense voltage is compared with a reference voltage to determine the cell's programmed/erased state. Current through neighbor cells is redirected to the sensing circuit using a special Y decoder to minimize the neighbor effect.

11 Claims, 4 Drawing Sheets

FIG. 4A   FIG. 4B

INTEGRATOR-BASED CURRENT SENSING CIRCUIT FOR READING MEMORY CELLS

RELATED APPLICATION

The present application claims priority of U.S. Patent Application Ser. No. 60/635,851 filed by Erez Sarig on Dec. 14, 2004.

FIELD OF THE INVENTION

The present invention relates to integrated circuit (IC) devices that operate using close to ground level ("near-ground") voltage signals. More specifically, the present invention relates to methods and architectures for sensing the programmed state of memory cells using near-ground signals.

RELATED ART

Memory devices, such as random access memory (RAM), read-only memory (ROM), non-volatile memory (NVM) and like, are known in the art. These devices provide an indication of the data that is stored therein by providing an output electrical signal. In general, conventional sense amplifiers determine the logical value stored in a cell by comparing, after a suitable set-up period, this output electrical signal with a fixed threshold voltage level. If the output signal is above the threshold, the cell is determined to be erased (e.g., with a logical value of binary 1), and if the output signal is below the threshold, the cell is determined to be programmed (e.g., with a logical value of 0). The threshold level is typically set at a voltage level that is between the expected erased and programmed voltage levels, and that is high enough (or sufficiently far from both expected voltage levels) so that noise will not cause false results. Unfortunately, a high threshold level requires that the cell being sensed (read) be given a sufficient amount of time to fully develop its signal, thereby ensuring that, for an erased cell, the resultant signal has reached its full (high) voltage level. In order to achieve signal development in a reasonable amount of time, the entire array is first brought (or "equalized") to a medium voltage level such that the cell being sensed either increases (if it is erased) or decreases (if it is programmed). However, this equalization operation is time-consuming and requires a considerable amount of power.

U.S. Pat. No. 6,128,226, entitled "Method and apparatus for operating with a close to ground signal", by Dr. B. Eitan et al., discloses a method for sensing (reading) memory cells by sensing a signal from a cell that has risen from ground while the voltage level of the sensed cell signal is still close to the ground level, thereby reducing read time and power consumption when compared with conventional techniques. FIG. 1 shows a memory array 8 and a sense amplifier 20 that are disclosed by Dr. Eitan. Memory array 8 has a multiplicity of cells 10 that are organized into rows and columns. The gates of a single row of cells are connected to a word line WL, the sources of a column of cells are connected to a first bit line BL, and the drains of the column are connected to a second bit line. All the bit lines BL are connected to a Y decoder 12, which couples associated bit line pairs to facilitate read operations. For example, to read a cell 10A, Y decoder 12 couples bit line BLS to a supply line 14 that is maintained at a fixed voltage $V_{BL}$, and couples bit line BLD to a sensing line 16. When word line WLA is subsequently turned on, cell 10A responds and the voltage on sensing line 16 will develop accordingly, to be measured by sense amplifier 20. Sense amplifier 20 includes an amplifying comparator 22, a reference unit 24, and a timing unit 28. Amplifying comparator 22 receives the sensed cell signal $V_{CELL}$, which is developed on sensing line 16, a reference signal $V_{REF}$ from reference unit 24, and a control signal $Ø_2$ from timing unit 28, and produces a sense data output signal $V_{OUT}$. Connected to sensing line 16 is an N-channel Metal Oxide Semiconductor (NMOS) switching transistor 18 that is controlled by a control signal $Ø_1$. Switching transistor 18 connects sensing line 16 with either sense amplifier 20 or with a ground supply. When $Ø_1$ is high, switching transistor 18 is active (turned on), allowing connection between sensing line 16 and the ground supply, and thereby discharging cell 10A. However, when $Ø_1$ is low, switching transistor 18 is inactive (turned off), which permits data flow between sensing line 16 and sense amplifier 20. Signal $Ø_1$ is also provided to amplifying comparator 22, reference unit 24 and timing unit 28, where it functions in a similar manner to force the signals of interest to develop from the ground voltage.

FIGS. 2A through 2D are timing diagrams showing various signals used by the circuit shown in FIG. 1 during a cell sensing (read) operation. Referring to FIG. 2A, signal $Ø_1$ remains high during a time period 32, during which the source of sensed cell 10A is discharged (or "pre-charged") to ground. At the end of this discharge phase, signal $Ø_1$ changes state and remains in the changed state for a development phase 34 long enough for the cell signal $V_{CELL}$ to be developed (i.e., increase from the ground level) and read (i.e., compared with a reference voltage $V_{REF}$). At the end of development and read phases (i.e., at time T3), signal $Ø_1$ changes state again, after which, sense amplifier 20 provides a valid data output, indicative of the content of the cell 10A. FIG. 2B illustrates the operation of timing unit 28. A signal $V_{TIMER}$ begins developing from ground at the start of the development phase (i.e., at time T1), and when signal $V_{TIMER}$ reaches or exceeds a fixed voltage level $V_{DC-REF}$, timing unit 22 makes a change in control signal $Ø_2$, shown in FIG. 2C. Signal $Ø_2$ is active for an output period 38 (i.e., time T2 to T3, corresponding to the read phase) during which amplifying comparator 22 produces a signal representative of the data value stored by cell 10A. FIG. 2D shows the operation of amplifying comparator 22. At time T1, which occurs at the beginning of the discharge phase, reference unit 24 begins developing reference signal $V_{REF}$ from ground. At the same time, the cell 10A, which was discharged to ground, begins charging with the voltage on the supply line 14, thereby generating a signal $V_{CELL}$ on sensing line 16. Dr. Eitan teaches that reference signal $V_{REF}$ develops with the same characteristics and environment as the sensed cell signal $V_{CELL}$, but at a different rate. At time T2, the development phase (time period T1 to T2) ends and the read (output) phase begins (indicated by the high value 38 associated with control signal $Ø_2$), during which amplifying comparator 22 compares the voltage level $V_{CELL}$ on sensing line 16 with the reference signal $V_{REF}$ produced by reference unit 24. This comparison continues until the end of the read phase (i.e., at time T3). As indicated in FIG. 2D, when programmed, cell 10A exhibits high electrical resistance and, as such, provides low current and hence a slow voltage rise (indicated by voltage profile $V_{CELL-PROGRAMMED}$). When erased, cell 10A exhibits low electrical resistance and, as such, provides high current and hence a fast voltage rise (indicated by voltage profile $V_{CELL-ERASED}$). As can be seen in FIG. 2D, the reference signal $V_{REF}$ has a voltage profile between $V_{CELL-ERASED}$ and $V_{CELL-PROGRAMMED}$, and thus amplifying comparator 22 (FIG. 1) is able to determine the programmed state of cell 10A when the cell voltage (i.e., either $V_{CELL-ERASED}$ or $V_{CELL-PROGRAMMED}$) is close to ground (near ground) by comparing the cell voltage with the reference signal $V_{REF}$.

A problem with the approach taught by Dr. Eitan is that it suffers from a "neighbor effect" that can cause the erroneous detection of a programmed state (logic 0) when a cell is actually erased (logic 1). Referring again to FIG. 1, during the sensing (reading) of cell 10A, a drain-to-source voltage develops across a neighbor cell 10N, which is connected between rightmost terminal of the sensed cell 10A and an adjacent bit line BLN. If neighbor cell 10N is erased, neighbor cell 10N will conduct some of the sensed cell current on bit line BLD to bit line BLN (assuming bit line BLN is maintained at a fixed voltage), thereby charging its own source/drain-associated capacitance. This sensed cell current leakage can also pass to cell 10N's neighboring cell (i.e., cell 10N2), if it is also erased, and so on down the row of cells until a programmed cell is encountered. Therefore, the amount of leakage is difficult to predict and compensate for because the amount of leakage is at least partially dependent on the programmed state of neighbor cell 10N, neighbor's neighbor cell 10N2, and so on. Note also that the resistance of erased cells varies, and that in some instances the sensed cell signal $V_{CELL}$ of an erased cell may at a rate that is only slightly faster than the reference voltage $V_{REF}$. Thus, for any given cell sensing operation, the accurate reading of an erased cell depends upon how fully the sensed cell is erased, whether neighbor cell 10N is programmed or erased, and also on the programmed/erased state of the neighbor's neighbor (i.e., cell 10N2). In the worst case, if the sensed cell is only partially erased and the neighbor cells 10N and 10N2 are erased, the resulting current drawn through these neighbor cells can cause the signal on line BLD to increase more slowly than if the sensed cell were programmed, thereby possibly resulting in an erroneous "cell programmed" (logic 0) detection when cell 10A is in fact erased. For example, as indicated in FIG. 2D, if the neighboring cells draw sufficient current, an erased cell signal $V_{CE-NE}$ may remain below reference signal $V_{REF}$, thereby causing the sense amplifier to generate an erroneous "cell programmed" output signal.

In addition to the neighbor effect, another problem encountered by the approach taught by Dr. Eitan is that comparator 22 is subject to random internal voltage offsets that can also cause erroneous programmed/erased readings. As known in the art, the cell reading operation described above is typically performed multiple times (i.e., using multiple comparators 22) to simultaneously read a "byte" of information stored in memory array 8. Random internal voltage offsets arise in these multiple comparators for various reasons, including device geometry mismatches and process fluctuations. Because these internal voltage offsets are random, and because the near-ground voltage signals read by the comparators leave very little room for error, two comparators 22 may generate different programmed/erased readings for the same sensed cell signal $V_{CELL}$ and reference signal $V_{REF}$, thus resulting in erroneous programmed/erased readings. Another cause of voltage offsets is the parasitic capacitance of bit lines and decoding lines, which are charged while sensing and directly relate to the sensing accuracy. A mismatch between the reference capacitance and any cell capacitance may cause offset.

What is needed is a method and apparatus for sensing the programmed state of memory cells using a close to ground signal that avoids the neighbor effect and random internal voltage offset effect, described above.

SUMMARY

The present invention is directed to a method and apparatus for sensing the programmed/erased state of a selected memory cell using an integrator to read the source current of the selected memory cell. The selected memory cell is biased to be in saturation by applying a suitable gate voltage and a drain voltage that produces a near-ground source voltage. The resulting source current generated through the selected memory cell initially flows to ground through a ground connection. The integrator is separated from the ground connection by an isolation capacitor, and at this time is set to an operation point. The ground connection is then turned off, and the source current is applied to an input terminal of the integrator through the isolation capacitor, causing the integrator to generate an amplified cell signal whose voltage level indicates the programmed/erased state of the selected memory cell. The cell signal is compared with a reference signal that is generated using a similar integrator, and the comparator output signal represents the stored data value.

The present invention provides several benefits over conventional cell measuring methods. First, because the source current is measured instead of the source voltage, power is saved because there is no need to charge and discharge bit lines at the source side (i.e., the source side voltage level remains close to ground). Further, the random internal voltage offset effect is avoided because each sensing circuit includes its own offset cancellation mechanism, which is directly derived from the sensing concept. In particular, each integrator is set, prior to sensing, to its DC operation level, and this level is isolated from the input and output of the integrator using the isolation and feedback capacitors. The mismatch between bit line and metal line parasitic capacitance are also solved because the integration (feedback) capacitor is an intentionally-formed element, and not a parasitic capacitor. Finally, another advantage is the sensitivity of the sensing circuit, due to the fact that integration (feedback) capacitor is a non-parasitic device, its size can be small, creating a large current-to-voltage transfer function, resulting in high accuracy and low offset.

In accordance with an embodiment of the present invention, one or more neighboring bit lines are also coupled to the sense amplifier during the read process, thus reducing or eliminating the neighbor effect by conveying any current passing through neighboring cells to the sensing circuit.

The present invention will be more fully understood in view of the description and drawings provided below.

BRIEF DESCRIPTION OF THE DRAWINGS

FIG. 4A is timing diagram showing a first control signal associated with a near-ground sensing procedure utilized in the memory array of FIG. 3;

FIG. 4B is timing diagram showing a second control signal utilized during operation of the memory array of FIG. 3;

DETAILED DESCRIPTION

The present invention is directed to the operation of non-volatile memory (NVM) cells using near-ground signals in a manner that prevents the erroneous neighbor effect described above. While the invention is described herein with specific reference to simplified NVM cells arranged in a simplified NVM array, it is noted that the present invention may be applied to many types of NVM cells (e.g., EPROM, EEPROM, flash, one-time programmable (fuse) cells, and multi-bit NVM cells such as those disclosed in U.S. Pat. No. 6,011,725, which is incorporated herein by reference) be utilized in many circuit settings (e.g., as dedicated NVM devices, or part of a more complex integrated circuit). Accordingly, the memory circuits described below are intended to be illustrative and not limiting.

Figure 1:
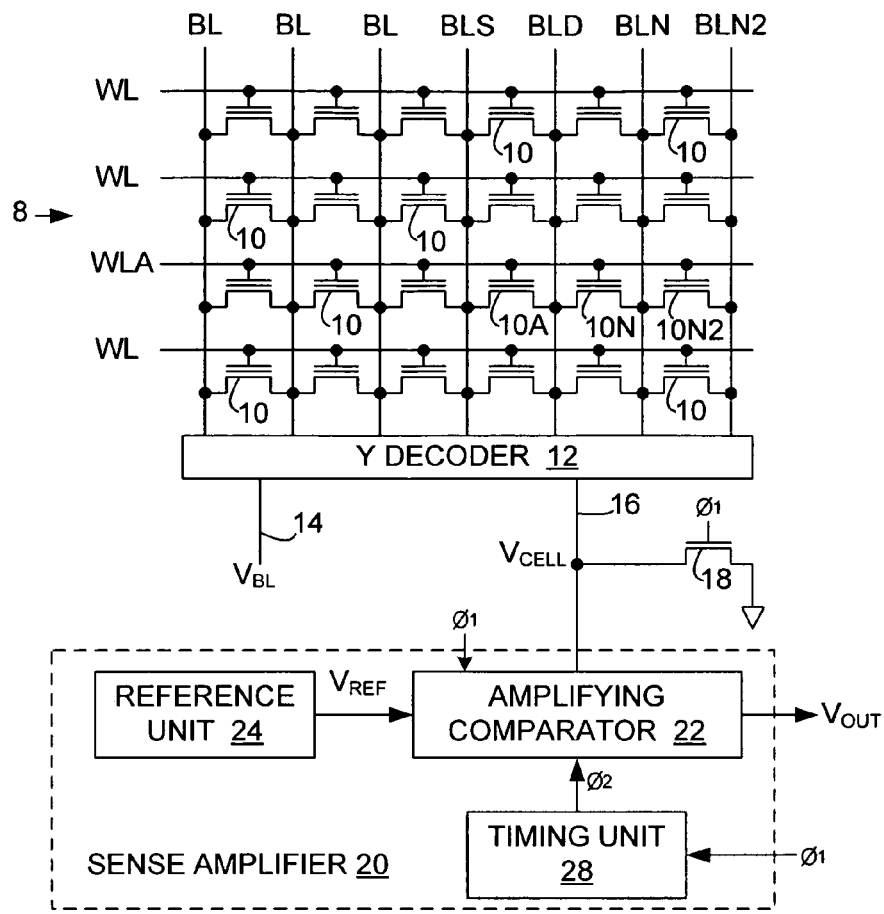
FIG. 1 is a schematic illustration of a conventional memory array and a sense amplifier.
Figure 2A:
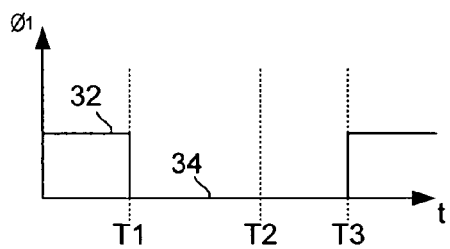
FIG. 2A is timing diagram showing a first control signal associated with a near-ground sensing procedure utilized in the memory array of FIG. 1.
Figure 2B:
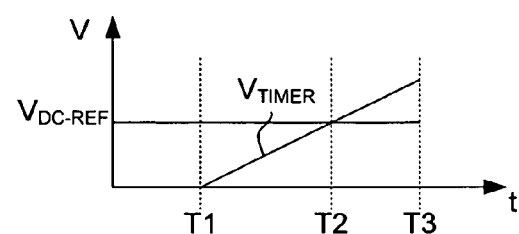
FIG. 2B is timing diagram showing a timing signal utilized during operation of the memory array of FIG. 1.
Figure 2C:
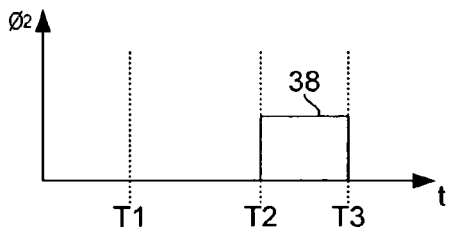
FIG. 2C is timing diagram showing a second control signal utilized during operation of the memory array of FIG. 1.
Figure 2D:
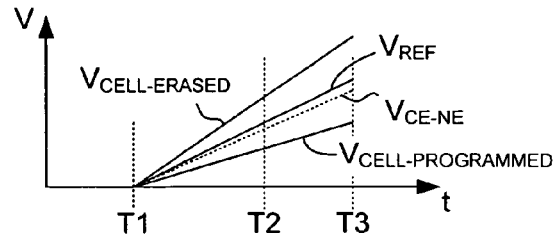
FIG. 2D is timing diagram showing voltage profiles of programmed and erased cells, along with a reference signal, utilized during operation of the memory array of FIG. 1.
Figure 3:
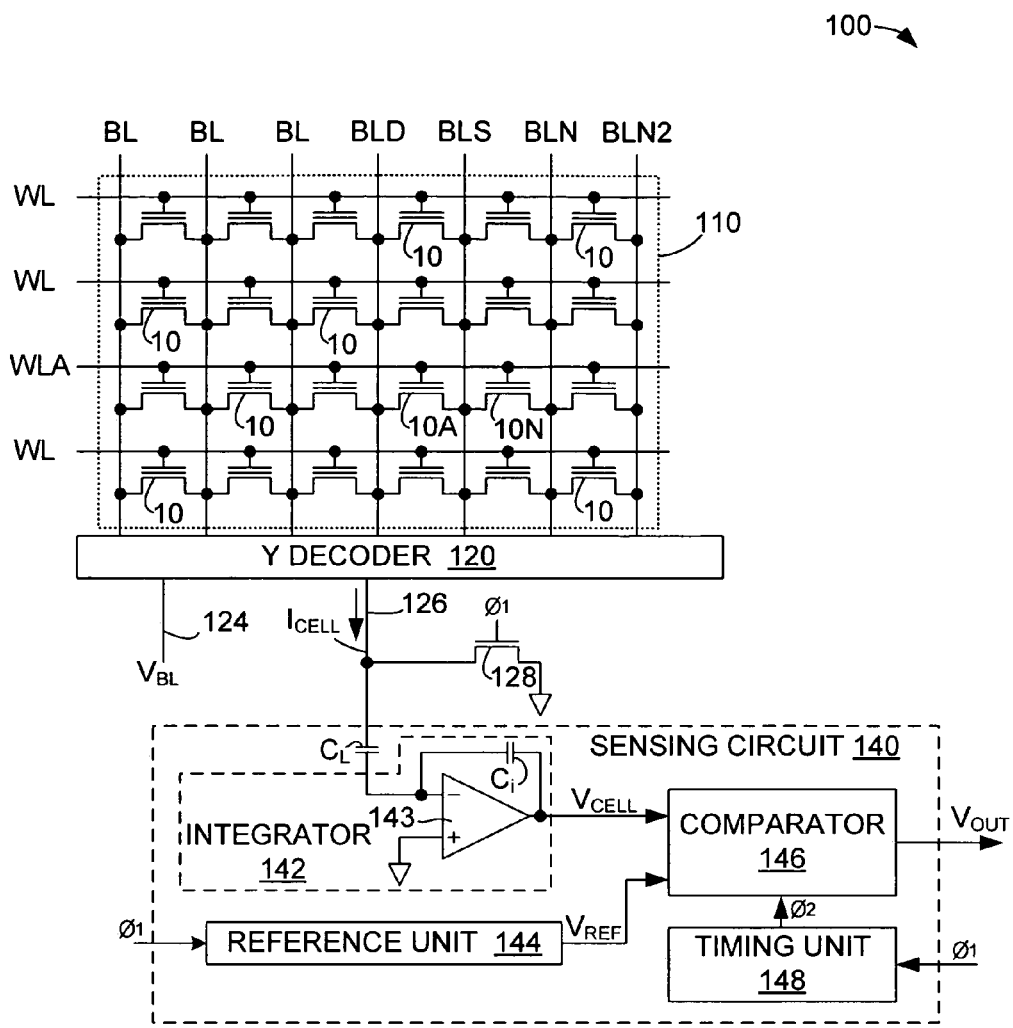
FIG. 3 is a schematic illustration of a memory array and a sense amplifier arrangement utilized in accordance with an embodiment of the present invention.

FIG. 3 shows a memory circuit 100 including an array 110 and a Y decoder (e.g., a multiplexer) 120 that operate in a manner similar to that disclosed in U.S. Pat. No. 6,128,226 (discussed above and incorporated herein by reference in its entirety). Memory circuit 100 also includes a current sensing circuit 140 for detecting the programmed state of NVM cells 10 located in memory array 110.

Memory array 110 includes NVM cells 10 that are arranged into rows and columns. The gates of each row of NVM cells are connected to a word line WL, and the source and drain terminals of each NVM cell are connected to associated bit lines BL. For example, (first) NVM cell 10A has a gate terminal connected to word line WLA, a first (source) terminal connected to a (first) bit line BLS, and a second (drain) terminal connected to a (second) bit line BLD. A neighbor (second) NVM cell 10N, which is located immediately adjacent to NVM cell 10A, has a gate terminal connected to word line WLA, a first terminal connected to bit line BLS, and a second terminal connected to a (third) bit line BLN.

The bit lines BL of memory array 110 are connected to Y decoder 120, which selectively couples the bit lines of array 110 to either a signal source, or to sense circuit 140 via a sensing signal line 126. As indicated on the lower portion of Y decoder 120, the signal sources selectively coupled to the bit lines include a (first) voltage source that generates a non-zero voltage signal $V_{BL}$ on a signal line 124, and a first N-channel Metal Oxide Semiconductor (NMOS) select transistor 128 for selectively coupling sensing signal line 126 to ground. A control circuit (not shown) controls Y decoder 120 to selectively couple bit lines to signal line 124 and sensing signal line 126. In addition, this control circuit generates control signal $Ø_1$, which controls select transistor 128 to couple selected bit lines to ground. In particular, when control signal $Ø_1$ is high, select transistor 128 is turned on, thereby coupling sensing signal line 126 to ground, and pulling down associated bit line that is coupled to sensing signal line 126 and signal line 127 via Y decoder 120. Conversely, when control signal $Ø_1$ is low, select transistor 128 is turned off, which permits current flow between a first selected bit line and sense circuit 140 via sensing signal line 126.

Sensing circuit 140, which is coupled to Y decoder 120 via sensing signal line 126, includes an isolation capacitor $C_L$, an integrator 142, a reference unit 144, a comparator 146, and a timing unit 148. Integrator 142 includes an operational amplifier (op amp) 143 and a feedback capacitor $C_I$ that is connected between the output terminal and inverting (−) input terminal of op amp 143. The inverting (−) input terminal of op amp 143 is also coupled to sensing signal line 126 by way of isolation capacitor $C_L$. The non-inverting (+) input terminal of op amp 143 is connected to a low voltage source (e.g., ground). Comparator 146 receives a cell voltage $V_{CELL}$ generated by integrator 142 in the manner described below, control signal $Ø_1$, a reference signal $V_{REF}$ from reference unit 144, and a control signal $Ø_2$ from timing unit 148. Comparator 142 utilizes these signals to produce a data output signal $V_{OUT}$ having a voltage level that indicates a programmed/erased state of the selected NVM cell. Reference unit 144 receives control signal $Ø_1$, and generates reference signal $V_{REF}$ (shown in FIG. 4C) that gradually declines from a predetermined high voltage level in the manner described below when control signal $Ø_1$ switches low. Timing unit 148 generates control signal $Ø_2$ according to the timing diagram shown in FIG. 4B and described below.

A method for performing near-ground sensing (reading) of NVM cell 10A (FIG. 3) according to an embodiment of the present invention will now be described.

To access NVM cell 10A for this sensing operation, the control circuit (not shown) of memory circuit 100 controls Y decoder 120 to couple bit line BLD to signal line 124 (i.e., to fixed voltage $V_{BL}$), and to couple bit line BLS to sensing signal line 126. In addition to controlling Y decoder 120, the control circuit of memory circuit 100 generates control signal $Ø_1$ according to the timing diagram shown in FIG. 4A, which is utilized in the manner described below to perform near-ground sensing of selected NVM cell 10A.

Figure 4C:
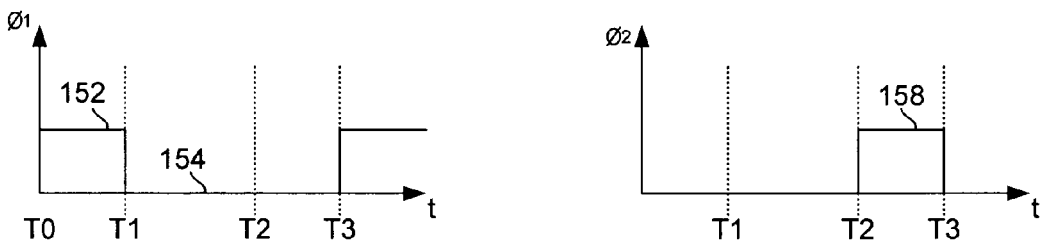
FIG. 4C is timing diagram showing voltage profiles of programmed and erased cells, along with a reference signal, utilized during operation of the memory array of FIG. 3.
Figure 4C:
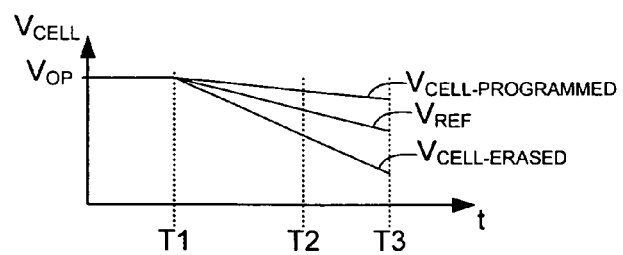
Figure 5A:
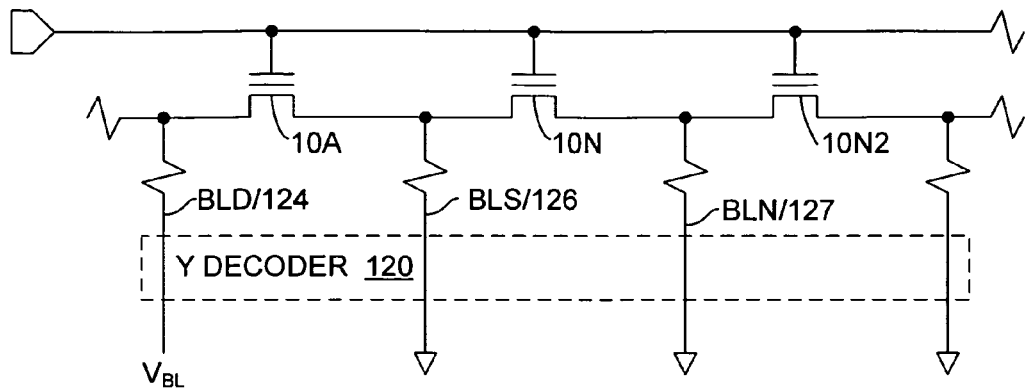
FIG. 5A is a simplified schematic diagram showing an equivalent memory array circuit generated during a discharge (first) phase of the near-ground sensing procedure according to an embodiment of the present invention.

During the discharge (first) phase (i.e., times T0 to T1 in FIGS. 4A to 4C), control signal $Ø_1$ is driven high, thereby turning on select transistor 128. FIG. 5A is a simplified circuit diagram showing an equivalent circuit generated during the discharge phase. Note that turning on select transistor 128 couples bit line BLS to ground via sensing signal line 126, thereby discharging this bit line. Note also that the voltage on bit line BLD is stabilized at fixed voltage $V_{BL}$ at time T1, and is isolated from integrator 142 to capacitor $C_L$, which allows integrator 142 to become set at an operating point ($V_{OP}$; FIG. 4C).

Figure 5B:
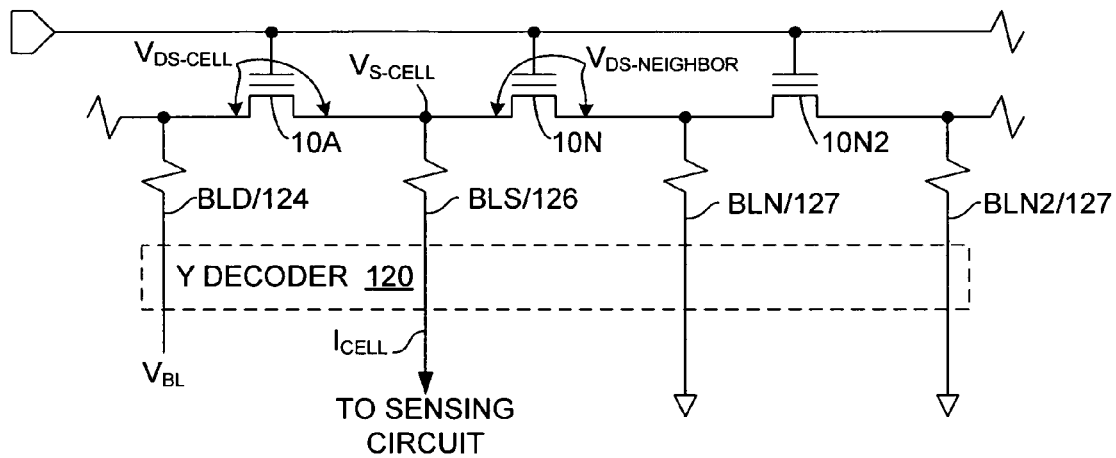
FIG. 5B is a simplified schematic diagram showing an equivalent memory array circuit generated during development (second) and read (third) phases of the near-ground sensing procedure of the present invention.

Referring again to FIG. 4A, during a development (second) phase 154 of the cell sensing operation (i.e., time T1 to T2 in FIGS. 4A-4C), control signal $Ø_1$ is driven low, thereby turning off select transistor 128 and decoupling bit line BLS from ground. As indicated by the resulting equivalent circuit shown in FIG. 5B, turning off select transistor 128 effectively couples NVM cell 10A between voltage signal $V_{BL}$ (via bit line BLD and signal line 124) and sense amplifier 140 (via bit line BLS and sensing signal line 126). Accordingly, starting at time T1, the cell current $I_{CELL}$ on bit line BLS and sensing signal line 126, which is generated in response to the current passing through NVM cell 10A from bit line BLD, is passed to integrator 142 by way of isolation capacitor $C_L$. Integrator 142 generates a cell signal $V_{CELL}$ in response to the applied cell current $I_{CELL}$. For a given bit line voltage $V_{BL}$, the amount of cell current $I_{CELL}$ passed by selected memory cell 10A, and thus the cell signal $V_{CELL}$ generated by integrator 142, is determined by the programmed/erased state of NVM cell 10A. In particular, as indicated in FIG. 4C, when NVM cell 10A is programmed, the resistance provided by NVM cell 10A is relatively high, thereby resulting in a relatively low cell current $I_{CELL}$, thus causing integrator 142 to generate a relatively slowly declining programmed cell signal $V_{CELL-PROGRAMMED}$. Conversely, when NVM cell 10A is erased, the resistance generated by NVM cell 10A is relatively low, thereby resulting in a relatively high cell current and a relatively rapidly declining erased signal $V_{CELL-ERASED}$. Note that the ratio of the cell signal (i.e., $V_{CELL-PROGRAMMED}$ or $V_{CELL-ERASED}$) generated by integrator 142 to the cell current $I_{CELL}$ is mainly dependent on the capacitance of feedback capacitor $C_i$, and not on the parasitic capacitance produced by the bit lines and associated structures coupled between selected cell 10A and operational amplifier 143. After specific sensing period, timing unit 148 switches signal $Ø_2$ high (shown in FIG. 4B), which is active for a read (third) period 158, during which comparator 146 produces a signal representative of the data value stored by NVM cell 10A. In particular, during the read phase, cell signal $V_{CELL}$, which is generated by integrator 142, is compared with reference signal $V_{REF}$, which is generated by reference unit 144, to determine the programmed/erased state of NVM cell 10A. As indicated in FIG. 4C, similar to the conventional methods described above, reference signal $V_{REF}$ declines from the same predetermined fixed voltage as that generated by integrator 142 beginning at time T1 at a rate that is faster than the programmed cell signal $V_{CELL-PROGRAMMED}$ and slower than the erased cell signal $V_{CELL-ERASED}$, thereby facilitating detection of the programmed/erased state of the first NVM cell. Therefore, between times T1 and T3, when integrator 142 generates programmed cell signal $V_{CELL-PROGRAMMED}$, comparator 146 generates a first $V_{OUT}$ value (e.g., with a logical value of binary 0), and when integrator 142 generates erased cell signal $V_{CELL-ERASED}$, comparator 146 generates a second $V_{OUT}$ value (e.g., with a logical value of binary 1). Accordingly, as indicated in FIG. 4C, the programmed/erased state of NVM cell 10A is easily determined by comparing the instantaneous voltage levels of reference signal $V_{REF}$ and the programmed/erased cell signal.

As set forth above, the present invention is distinguished over the conventional method in that the source current (not the source voltage) is utilized to determine the programmed/erased state of a selected memory cell. Using source current to determine the programmed state of the selected cell provides several benefits. First, because current is measured instead of voltage, as indicated in FIG. 5A, non-zero voltage signal $V_{BL}$ generated on a signal line 124 may be set such that it produces the desired source current (e.g., approximately 5 µA), but produces near-ground source voltage ($V_{S-CELL}$ approximately equals 20 to 50 mV) on bit line BLS. In the present context, the phrase "near-ground" is defined to be a minimum voltage needed to overcome the resistance of the bit line and pass transistors along the source line from the sensing circuit up to the cell source side, and accounts for the final integrator gain, which in one embodiment causes the source line to rise slightly (during sensing) to be around 20 mV (previous art rises above 200 mV). By reading the selected memory cell 10A such that source voltage $V_{S-CELL}$ is near-ground, the present invention facilitates low voltage operation of the memory array. Further, by maintaining source voltage $V_{S-CELL}$ at substantially zero volts, the neighbor effect (described above) is reduced because the voltage across neighbor cell 10N is insufficient to generate a significant current through neighbor cell 10N, even when erased. Moreover, the random internal voltage offset effect and the mismatch between bit line and metal line parasitic capacitance are avoided because integration (feedback) capacitor $C_i$ is a device, not a parasitic capacitor, and therefore not subject to the random variations generated by parasitic capacitors.

Figure 6:
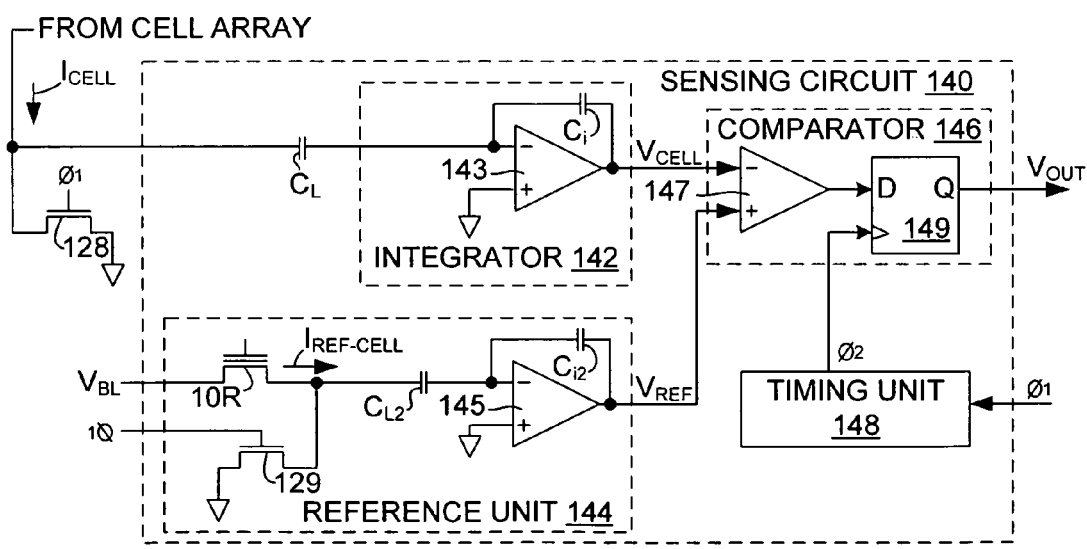
FIG. 6 is a schematic diagram showing a sensing circuit utilized in the memory array of FIG. 3 according to an embodiment of the present invention.

FIG. 6 is a circuit diagram showing sensing circuit 140 in additional detail in accordance with a specific embodiment of the present invention. Comparator 146 includes a (second) operational amplifier 147 having an inverting (first) input terminal connected to the output terminal of operational amplifier 143, and a non-inverting (second) input terminal connected to receive reference signal $V_{REF}$ from reference unit 144. Reference unit 144 includes a reference memory cell 10R that is controlled in the manner described above with reference to selected memory cell 10A to generate a reference cell current $I_{REF-CELL}$, which is selectively coupled either to ground via switch 129 or to a comparator made up of a (third) operational amplifier 145 and an associated feedback capacitor $C_{i2}$. The reference signal $V_{REF}$ thus generated by op amp 145 is compared with cell signal $V_{CELL}$, and the resulting comparison signal is applied to a suitable data capture circuit (e.g., a flip-flop 149) that is controlled by control signal $Ø_2$ to capture and generate sense data output signal $V_{OUT}$.

Figure 7:
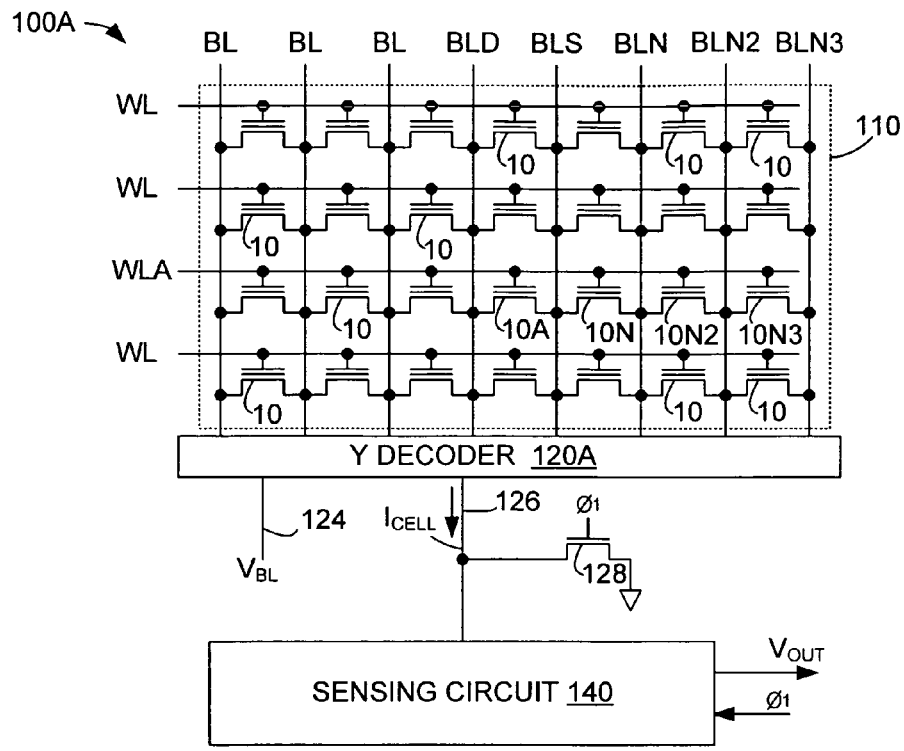
FIG. 7 is a schematic illustration of a memory array in accordance with another embodiment of the present invention.

FIG. 7 shows a memory circuit 100A including array 110 (described above) and a Y decoder (e.g., a multiplexer) 120A that operate similar to the embodiments described above, but provide the additional function described below. Memory circuit 100A also includes current sensing circuit 140, which is substantially identical to the embodiments described above.

As indicated in FIG. 7, the row of memory array 110 including selected memory cell 110A also includes a plurality of neighbor memory cells 10N, 10N2 and 10N3 that are connected in series to the source terminal of selected memory cell 10A. Each of the plurality of neighbor memory cells is coupled to one or more of neighbor bit lines BLN, BLN2 and BLN3. In accordance with the present embodiment, Y decoder 120A is distinguished from the conventional decoder circuit in that it couples at least one of neighboring bit lines BLN, BLN2 and BLN3 to sensing signal line 126 while cell current $I_{CELL}$ is flowing in bit line BLS.

Figure 8:
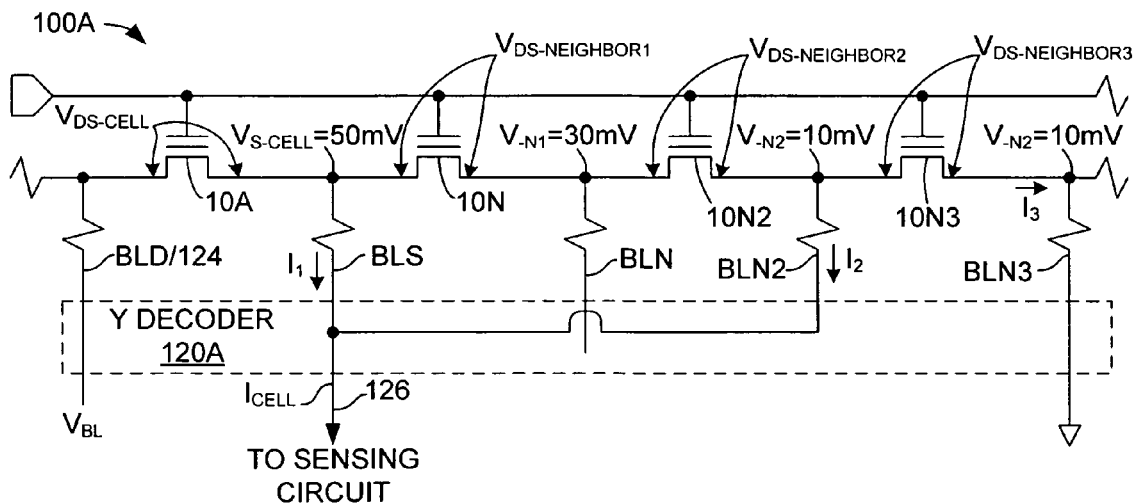
FIG. 8 is a simplified schematic diagram showing an equivalent memory array circuit generated during the read phase of the near-ground sensing procedure according to another embodiment of the present invention.

FIG. 8 shows an equivalent circuit of memory circuit 100A during a read operation according to a specific embodiment of the present invention. In this example, it is assumed that the source side voltage $V_{S\text{-}CELL}$ generated on bit line BLS is equal to 50 mV, and that neighbor memory cells 10N, 10N2 and 10N3 are erased. In this example, Y decoder 120A decouples neighbor bit line BLN, and couples neighbor bit line BLN2 to sensing signal line 126. Accordingly, the cell current $I_{CELL}$ transmitted to sensing circuit 140 is equal to a first current $I_1$ flowing on bit line BLS and a second current $I_2$ flowing on neighbor bit line BLN2. In this way, any current $I_2$ passing through neighbor cells 10N and 10N2 is collected back at sensing signal line 126. Using this technique, the only current loss during the read operation is the current $I_3$ flowing through neighbor memory cell 10N3, but this current is typically very small (e.g., assuming 20 mV drop through each erased memory cell 10N and 10N2, the source voltage $V_{\text{-}N2}$ on bit line BLN2 would be 10 mV, which would generate an insignificant current $I_3$ through neighbor memory cell 10N3). Thus, Y decoder 120A thus reduces or eliminates the neighbor effect by conveying any current passing through neighboring cells 10N and 10N2 to sensing circuit 140.

Although the invention has been described in connection with several embodiments, it is understood that this invention is not limited to the embodiments disclosed, but is capable of various modifications that would be apparent to a person skilled in the art. For example, although integrator 142, reference unit 144 and comparator 146 are depicted as including op amplifiers, known equivalent circuits may be utilized in place of these circuits. Moreover, the reference unit can be connected to more than one comparator, meaning each cell sensing circuit has one integrator and one comparator and the reference integrator output will enter all comparators giving the reference output value to all comparators. Thus, the invention is limited only by the following claims.

The invention claimed is:

1. A current sensing circuit for reading a selected memory cell, of a memory array, the memory array including means for generating a first fixed voltage across the selected memory cell such that a cell current flows from a first terminal to a second terminal through the selected memory cell and onto a sensing signal line, and such that a near-ground voltage is produced on the sensing signal line, wherein the current sensing circuit comprises:
   an integrator coupled to the sensing signal line; and
   a comparator having a first input terminal connected to an output terminal of the integrator, and a second input terminal connected to a reference signal source.

2. The current sensing circuit according to claim 1,
   wherein the integrator comprises a first operational amplifier and a first feedback capacitor connected between the output terminal of the first operational amplifier and an inverting input terminal of the first operational amplifier, and
   wherein the inverting input terminal of the first operational amplifier is coupled to the sensing signal line, and a non-inverting input terminal of the first operational amplifier is connected to a fixed voltage source.

3. The current sensing circuit according to claim 2, wherein the comparator comprises a second operational amplifier having a first input terminal connected to the output terminal of the first operational amplifier, and a second input terminal connected to the reference signal source.

4. The current sensing circuit according to claim 3,
   wherein the reference signal source comprises a third operational amplifier and a second feedback capacitor connected between an output terminal of the third operational amplifier and an inverting input terminal of the third operational amplifier,
   wherein the inverting input terminal of the third operational amplifier is coupled to the second terminal of a reference memory cell, and a non-inverting input terminal of the third operational amplifier is connected to a fixed voltage source, and
   wherein the output terminal of the third operational amplifier is connected to the non-inverting input terminal of the second operational amplifier.

5. An integrated circuit device comprising:
   an array of memory cells;
   switching means for generating a first fixed voltage across a selected memory cell of the array of memory cells such that a cell current flows from a first terminal to a second terminal through the selected memory cell, and for passing the cell current to a signal sensing line such that the signal sensing line is maintained at 50 mV or less;
   a current sensing circuit for reading a data value stored on the selected memory cell, the current sensing circuit including:
      integrating means coupled to the signal sensing line for integrating the cell current, and for generating a cell signal in response to the integrated cell current; and
      a comparator for generating a sense data output signal in response to a comparison between the cell signal and a reference signal.

6. The integrated circuit device of claim 5,
   wherein the integrating comprises a first operational amplifier and a first feedback capacitor connected between an output terminal of the first operational amplifier and an inverting input terminal of the first operational amplifier, and
   wherein the inverting input terminal of the first operational amplifier is coupled to the second terminal of the selected memory cell, and a non-inverting input terminal of the first operational amplifier is connected to a fixed voltage source.

7. The integrated circuit device according to claim 6, wherein the comparator comprises a second operational amplifier having a first input terminal connected to the output terminal of the first operational amplifier, and a second input terminal connected to the reference signal source.

8. The integrated circuit device according to claim 7,
   wherein the reference signal source comprises a third operational amplifier and a second feedback capacitor connected between an output terminal of the third operational amplifier and an inverting input terminal of the third operational amplifier,
   wherein the inverting input terminal of the third operational amplifier is coupled to the second terminal of a reference memory cell, and a non-inverting input terminal of the third operational amplifier is connected to a fixed voltage source, and
   wherein the output terminal of the third operational amplifier is connected to the non-inverting input terminal of the second operational amplifier.

9. The integrated circuit device according to claim 5, wherein the current sensing circuit further comprises an isolation capacitor connected between the signal sensing line and the integrating means.

10. The integrated circuit device according to claim 5, wherein the memory array includes a plurality of neighbor memory cells connected in series to the second terminal of the selected memory cell, each of the plurality of neighbor memory cells being coupled to a neighbor bit line, wherein the switching means comprises means for coupling at least one of the plurality of neighboring bit lines to the sensing signal line while the cell current is flowing from the first terminal to the second terminal through the selected memory cell.

11. A method for sensing a programmed/erased state of a selected memory cell within a memory array, the memory array including a first bit line connected to a first terminal of the selected cell, a second bit line connected to a second terminal of the selected NVM cell, the method comprising:

generating a first fixed voltage across the selected memory cell of the array of memory cells such that a cell current flows from the first bit line to the second bit line through the selected memory cell, and such that the second bit line is maintained at 50 mV or less;

generating a cell signal by integrating the cell current flowing on the second bit line; and generating a sense data output signal in response to a comparison between the cell signal and a reference signal.

* * * * *